United States Patent

Ishikawa et al.

[11] Patent Number: 5,922,964
[45] Date of Patent: Jul. 13, 1999

[54] AMPLITUDE DETECTING DEVICE

[75] Inventors: Nobuhiro Ishikawa; Motonori Ogihara, both of Ibaraki, Japan

[73] Assignee: Mitutoyo Corporation, Kanagawa, Japan

[21] Appl. No.: 08/881,412

[22] Filed: Jun. 24, 1997

[30] Foreign Application Priority Data

Jun. 25, 1996 [JP] Japan ..................... 8-164709

[51] Int. Cl.⁶ .................................................. G01H 13/00
[52] U.S. Cl. .............................................. 73/661; 341/115
[58] Field of Search .......................... 73/658, 659, 660, 73/661, 652; 33/539, 560, 561, 556; 324/160, 161; 361/239; 341/111, 112, 113, 114, 115, 116, 117

[56] References Cited

U.S. PATENT DOCUMENTS

| 4,397,188 | 8/1983 | Bansevichus et al. | 73/651 |
| 4,864,230 | 9/1989 | Howley | 324/161 |
| 5,247,751 | 9/1993 | Ohya et al. | 33/561 |
| 5,323,540 | 6/1994 | McMurtry et al. | 33/558 |
| 5,347,361 | 9/1994 | Kay | 356/350 |
| 5,435,072 | 7/1995 | Lloyd et al. | 33/559 |
| 5,463,393 | 10/1995 | Havlicsek | 341/115 |

FOREIGN PATENT DOCUMENTS

| 2 408 813 | 6/1979 | France . |
| 37 23 933 | 2/1989 | Netherlands . |
| 2 005 845 | 4/1979 | United Kingdom . |

OTHER PUBLICATIONS

Patent Abstract of Japan vol. 017, No. 261 (E–1369), May 21, 1993 & JP 05 003418 A (Mitsubishi Electric CORP.) Jan. 8, 1993.
European Search Report and Annex to the European Search Report.

*Primary Examiner*—Hezron Williams
*Assistant Examiner*—Helen C. Kwok
*Attorney, Agent, or Firm*—McDermott, Will & Emery

[57] ABSTRACT

The phase controlling circuit 1 controls the phase of the input sinusoidal signal S1 to generate first and second sinusoidal signal S1 and S2 which have different phases of 90° shifted from each other. The signal generating circuits 2a and 2b square the first and second sinusoidal signal S1 and S2 to generate first and second squared sinusoidal signals $S1^2$ and $S2^2$, respectively. The squared sinusoidal signals $S1^2$ and $S2^2$ are added by the signal adding circuit 3, thereby generating the added output S3 which is an amplitude of the input sinusoidal signal S. The phase controlling circuit 1 comprises 90° phase shift circuits 11 and 12 which have a common signal input terminal and the respective signal output terminals. The 90° phase shift circuit is composed of an all-pass filter whose central frequency is set to be f0–Δ f so as to generate the first sinusoidal signal. The second 90° phase shift circuit is composed of an all-pass filter whose central frequency is set to be f0+Δ f so as to generate the second sinusoidal signal.

11 Claims, 5 Drawing Sheets

1

AMPLITUDE DETECTING DEVICE

BACKGROUND OF THE INVENTION

1. FIELD OF THE INVENTION

The present invention relates to an amplitude detecting device for detecting an amplitude of a sinusoidal signal, which is especially useful for processing a signal output of a touch signal probe.

2. Prior Art

Conventionally, as a measuring apparatus for measuring shape or size of a to-be-measured object, a height gage, a three-dimensional measuring apparatus, a contour measuring apparatus and so on, are used. A contact-type measuring apparatus in the above-mentioned measuring apparatus has a touch signal probe which is used for detecting contact with the to-be measured object. Various contact detecting mechanism of the touch signal probe have been provided. One of these mechanism is to drive a piezoelectric device for applying vibration to a stylus. This method is useful for obtain a high-speed and high accuracy responsibility, when a long stylus is used.

FIG. 8 shows such a touch signal probe. A stylus 71 has a contact ball 73 on the front end and a balancer 74 on the rear end, and is held by a stylus holder 72 at almost central portion along axial direction thereof. On the central portion of the stylus 71, a piezoelectric device 75 is attached for applying vibration to the stylus 71. To the exciting electrode 75a, a driving signal is supplied by a driver 78. A electromechanically transformed signal on a detecting electrode 75b can be detected by a detecting circuit 76. A signal processing circuit 77 is used for processing the detected signal of the detecting circuit 76 to detect the touching of the stylus 71. The output of the detecting circuit 76 is fed forward to the driving circuit 78, whereby the piezoelectric device 75 may be excited in a resonant state at a predetermined resonant frequency.

Therefore, the detected signal on the detecting electrode 75b of the piezoelectric device 75 is a sinusoidal signal, and amplitude or frequency thereof is modulated by the contact between the contact ball 73 and the to-be-measured object.

FIG. 9 shows an example of such a modulated signal. The signal processing circuit 77 detects, for example, an amplitude variation of the output sinusoidal signal of the detecting circuit 76 so as to detect the contact of the stylus 71. As such the signal processing circuit 77 for detecting amplitude variation of the sinusoidal signal as shown in FIG. 9, a well-known demodulating circuit, which is used for demodulating an amplitude modulated signal, for example AM detector, can be used.

However, a conventional AM detector has a smoothing filter (LPF) for removing high frequency components. Therefore, it is difficult to detect rapid amplitude variation. Except that the amplitude variation of the sinusoidal signal as shown in FIG. 9 is sufficiently lower than the fundamental frequency thereof, when the amplitude variation is rapid, it is impossible to precisely detect the amplitude variation, due to the time delay in the smoothing filter. As a result, a high speed and high accuracy responsibility can not be obtained.

SUMMARY OF THE INVENTION

The present invention is to provide an amplitude detecting device with a high-speed and high accuracy responsibility, which is especially useful for a signal processing circuit of a touch signal probe with a vibrating stylus.

An amplitude detecting device according to the present invention comprises a phase controlling circuit for controlling phase of an input sinusoidal signal to generate first and second sinusoidal signals which have different phases of 90° shifted from each other, a first signal generating circuit for squaring the first sinusoidal signal output from the phase controlling means to generate a first squared sinusiodal signal, a second signal generating circuit for squaring the second sinusoidal signal output from the phase controlling circuit to generate a second squared sinusiodal signal, and a signal adding circuit for adding the first and second squared sinusiodal signals output from the first and second signal generating circuit to output an amplitude of the input sinusoidal signal.

In a preferred embodying mode of the present invention, the phase controlling circuit is composed of first and second 90° phase shift circuits, which have a common signal input terminal and the respective signal output terminals. The first 90° phase shift circuit is composed of an all-pass filter whose central frequency of phase shift is set to be $f0-\Delta f$ (where $f0$ is a fundamental frequency of the input sinusoidal signal, and $\Delta f$ is a frequency shift) so as to generate the first sinusoidal signal. The second 90° phase shift circuit is composed of an all-pass filter whose central frequency of phase shift is set to be $f0+\Delta f$ so as to generate the second sinusoidal signal of which phase is 90° different from the first sinusoidal signal around the fundamental frequency $f0$.

According to the present invention, by combination of phase controlling of the input sinusoidal signal to generate the first and second sinusoidal signals with 90° different phases from each other, squaring these signals to generate the first and second squared sinusoidal signals, and signal adding these signals, it is able to remove the fundamental frequency component of the input sinusoidal signal without smoothing filters so as to obtain an amplitude of the input sinusoidal signal. Since smoothing filters are not used, even when the amplitude information includes a high frequency component, the amplitude can be detected without time delay.

Therefore, in the case that the input signal is an output of a touch signal probe driven by a piezoelectric device, high speed amplitude detecting can be performed, even when the amplitude to be detected is on a transition state. As a result, if the amplitude detecting device of the present invention is applied for signal processing of the touch signal probe, it is possible to perform high speed signal processing.

Especially, in the present invention, it is available to use the first and second 90° phase shift circuits composed of all-pass filters with the central frequency of $f0-\Delta f$ and $f0+\Delta f$, respectively. By use of these circuits, even when the fundamental frequency component varies in the input sinusiodal signal, the fact has no influence on the amplitude detecting, and amplitude variation due to the phase shift processing is not generated. Therefore, in the case of applying the present invention to a touch signal probe, whose output signal includes both amplitude variation and frequency variation, it is able to precisely detect the amplitude.

DETAILED DESCRIPTION OF THE PREFERRED EMBODIMENTS

Figure 1:
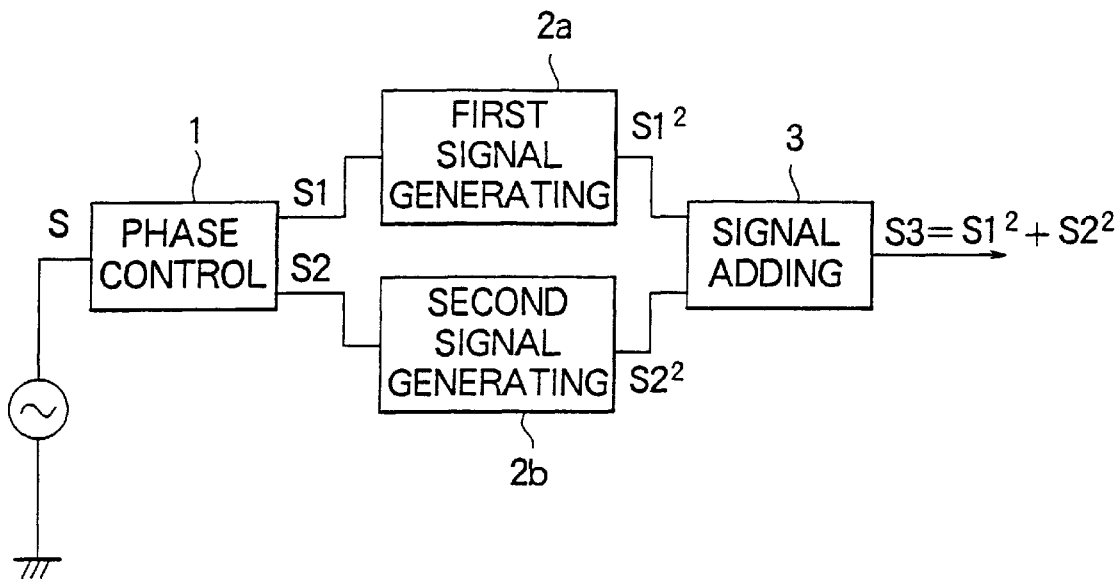
FIG. 1 shows a circuit blook of an amplitude detecting device according to an embodiment of the present invention.

Referring to the drawings, an embodiment of the present invention will now be described.

Figure 8:
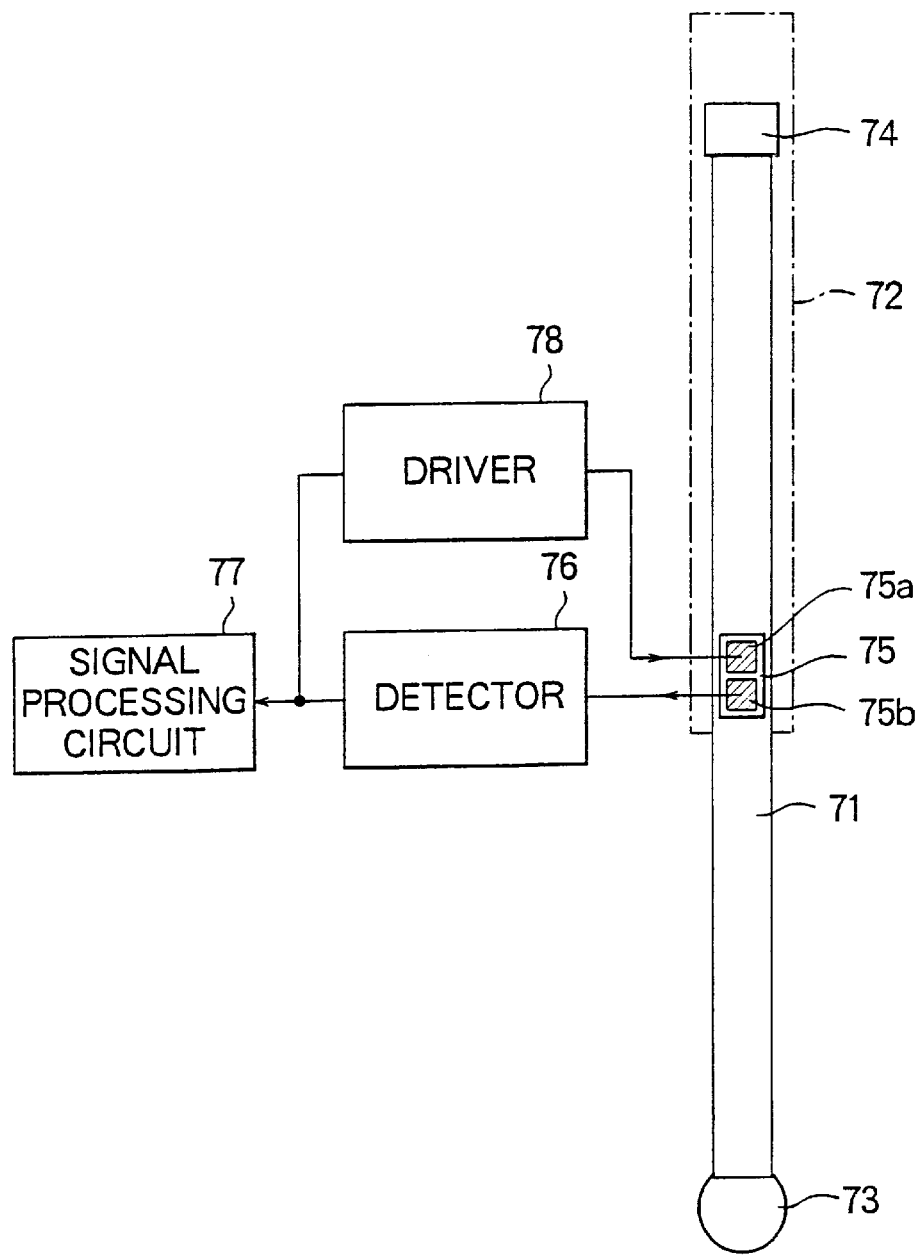
FIG. 8 shows a touch signal probe and detecting circuit thereof.
Figure 9:
FIG. 9 shows an output signal of the touch signal probe.

FIG. 1 shows a circuit disagram of an amplitude detecting device according to an embodiment. The input sinusoidal signal S is, for example, an output signal of the touch signal probe as shown in FIG. 8, and the amplitude detecting device is included in the signal processing circuit 77 shown in FIG. 8. The amplitude detecting device comprises a phase controlling circuit 1, first and second signal generating circuits 2a and 2b, and a signal adding circuit 3. The phase controlling circuit 1 is to control phase of the input sinusiodal signal S so as to generate first and second sinusoidal signals S1 and S2 whose phases are 90° different from each other. The first signal generating circuit 2a is to square the first sinusoidal signal S1 from the phase controlling circuit 1 to generate a first squared sinusoidal signal S1$^2$. The second signal generating circuit 2b is to square the second sinusoidal signal S2 from the phase controlling circuit 1 to generate a second squared sinusoidal signal S2$^2$. The signal adding circuit 3 is to add the first and second squared sinusoidal signals S1$^2$ and S2$^2$ to generate an output signal S3.

Figure 4:
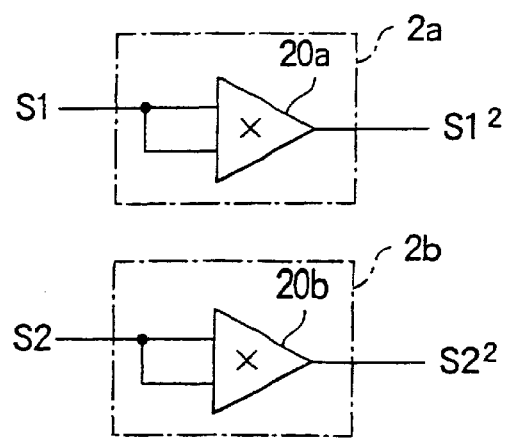
FIG. 4 shows signal generating circuits 2a, 2b in the embodiment.

The phase controlling circuit 1 will be described in detail later. The first and second signal generating circuits 2a and 2b are, For example, as shown in FIG. 4, composed of well-known analog multiplying circuits 20a and 20b, respectively. Two input terminals of each of the analog multiplying circuits 20a and 20b are connected. Therefore, the first sinusoidal signal S1 is provided to the analog multiplying circuit as both multiplier and multiplicand, thereby generating the first squared sinusoidal signal S1$^2$. Similarly, to the analog multiplying circuit 20b, the second sinusoidal signal S2 is provided as both multiplier and multiplicand. As a result, the analog multiplying circuit 20b can generate the second squared sinusoidal signal S2$^2$.

Alternatively, square-law demodulators can also be used for the first and second signal generating circuits 2a and 2b.

Figure 5:
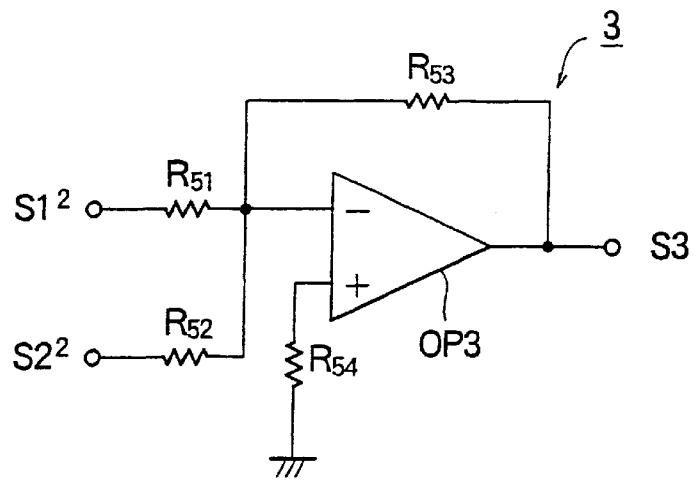
FIG. 5 shows a signal adding circuit 3 in the embodiment.

The signal adding circuit 3 is composed of a well-known analog adder with an operational amplifier OP3 as shown in FIG. 5.

For example, the input sinusoidal signal S has a fundamental frequency of ω and an amplitude A, as represented by the following expression (1).

$$S = A \cdot \sin \omega t \quad (1)$$

The phase controlling circuit 1 receives the input sinusoidal signal to generate the first and second sinusoidal signals S1 and S2, as represented by the following expression (2).

$$S1 = A \cdot \sin(\omega t + \alpha)$$

$$S2 = A \cdot \cos(\omega t + \alpha) \quad (2)$$

where, α is an arbitrary phase.

By squaring the first and second sinusoidal signals S1 and S2 in the signal generating circuits 2a and 2b, respectively, the first and second squared sinusoidal signals S1$^2$ and S2$^2$ can be generated as shown by the following expression (3).

$$S1^2 = A^2 \cdot \sin^2(\omega t + \alpha)$$

$$S2^2 = A^2 \cdot \cos^2(\omega t + \alpha) \quad (3)$$

Finally, by adding the first and second squared sinusoidal signal S1$^2$ and S2$^2$, the added output S3 can be generated as represented by the following expression (4).

$$S3 = S1^2 + S2^2 = A \cdot \sin^2(\omega t + \alpha) + A^2 \cdot \cos^2(\omega t + \alpha) = A^2 \quad (4)$$

According to the embodiment, as shown in the expression (4), the amplitude information in the input sinusoidal signal S can be detected.

Figure 2:
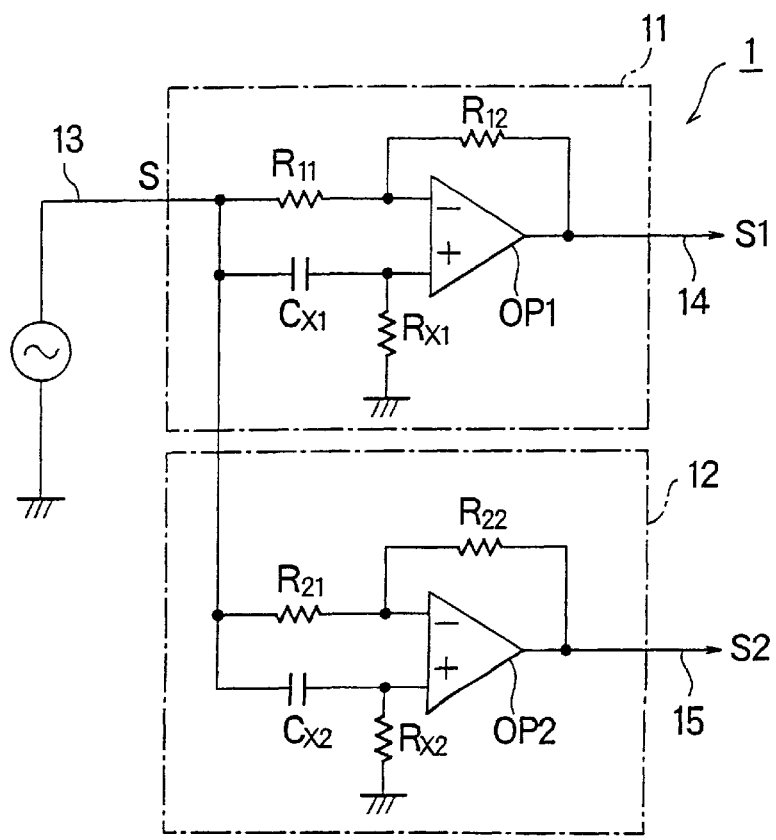
FIG. 2 shows a phase controlling circuit in the embodiment.

FIG. 2 shows an example of the phase controlling circuit 1 shown in FIG. 1. This phase controlling circuit 1 is composed of first and second 90° phase shift circuits 11 and 12 which have a common signal input terminal 13 to which the input sinusoidal signal S is provided, and the respective signal output terminals 14 and 15. The first and second 90° phase shift circuits 11 and 12 are composed of the respective all-pass filters with operational amplifiers OP1, OP2. In these all-pass filters, there are no amplitude limitation within the frequency band of the operational amplifiers OP1 and OP2. In the first 90° phase shift circuits 11, an input resistor R11 are connected between the signal input terminal 13 and an inverting input of the operational amplifier OP1, a feedback resistor R12 is connected between the inverting input and the signal output terminal 14, a capacitor Cx1 is connected between the signal input terminal 13 and a non-inverting input of the operational amplifier OP1, and a resistor Rx1 is connected between the non-inverting input and a reference potential terminal.

The second 90° phase shift circuits 12 comprises the operational amplifier OP2, an input resistor R21, a feedback resistor R22, a capacitor Cx2, and a resistor Rx2, as similar to the first 90° phase shift circuit 11.

Figure 3:
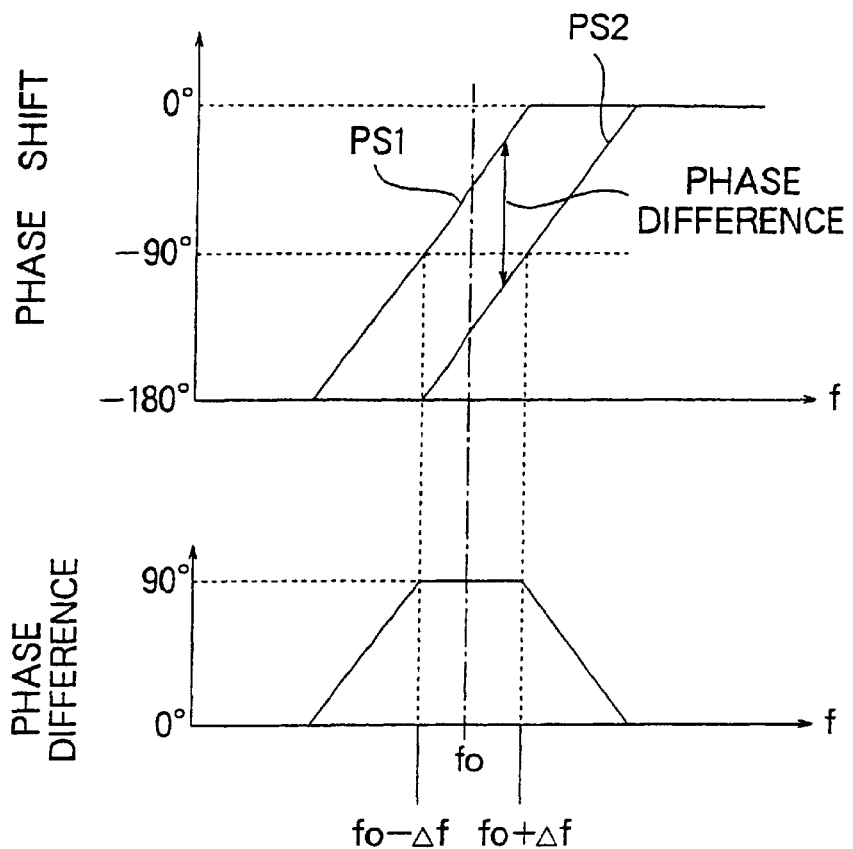
FIG. 3 shows a phase shift property of the phase controlling circuit.

By setting the values of Cx1 and Rx1, and Cx2 and Rx2, the first and second 90° phase shift circuits 11 and 12 have the respective phase shift properties PS1 and PS2, as shown in FIG. 3. In the first 90° phase shift circuit 11, the central frequency at which 90° phase shift occurs is set to be f0−Δ f, where f0 is a fundamental frequency corresponding to the angular frequency ω, and Δ f is a frequency shift. Contrary, in the second 90° phase shift circuit 12, the central frequency is set to be f0+Δ f.

In detail, the respective central frequencies of the first and second 90° phase shift circuits 11 and 12 are represented by the following expression (5) by use of the capacitors Cx1, Cx2 and resistors Rx1, Rx2.

$$f0 - \Delta f = \frac{1}{2\pi Cx1 \cdot Rx1}$$

$$f0 + \Delta f = \frac{1}{2\pi Cx2 \cdot Rx2} \quad (5)$$

Therefore, two sinusoidal signals S1 and S2, that have 90° different phases from each other in the range of f0±Δ f, can be output at the respective signal output terminals 14 and 15 of the first and second 90° phase shift circuits 11 and 12. Even if the fundamental frequency of the input sinusoidal signal S fluctuates (in fact, the output signal of the touch signal probe fluctuates), the phase difference between the two sinusoidal signals S1 and S2 is precisely to be 90° Based on the property of the all-pass filter, the amplitude difference between the sinusoidal signals S1 and S2 can be neglected. As a result, by the above-described squaring and adding operations, the amplitude information can be precisely detected.

According to the embodiment, the amplitude of the input sinusoidal signal can be detected by phase controlling, multiplying and adding. In the embodiment, no smoothing filters are used. Therefore, even when the amplitude to be measured changes with a high frequency, the amplitude can be detected without time delay. Additionally, when the embodiment is applied to a touch signal probe, it is able to perform the signal processing with high speed responsibility.

Figure 6:
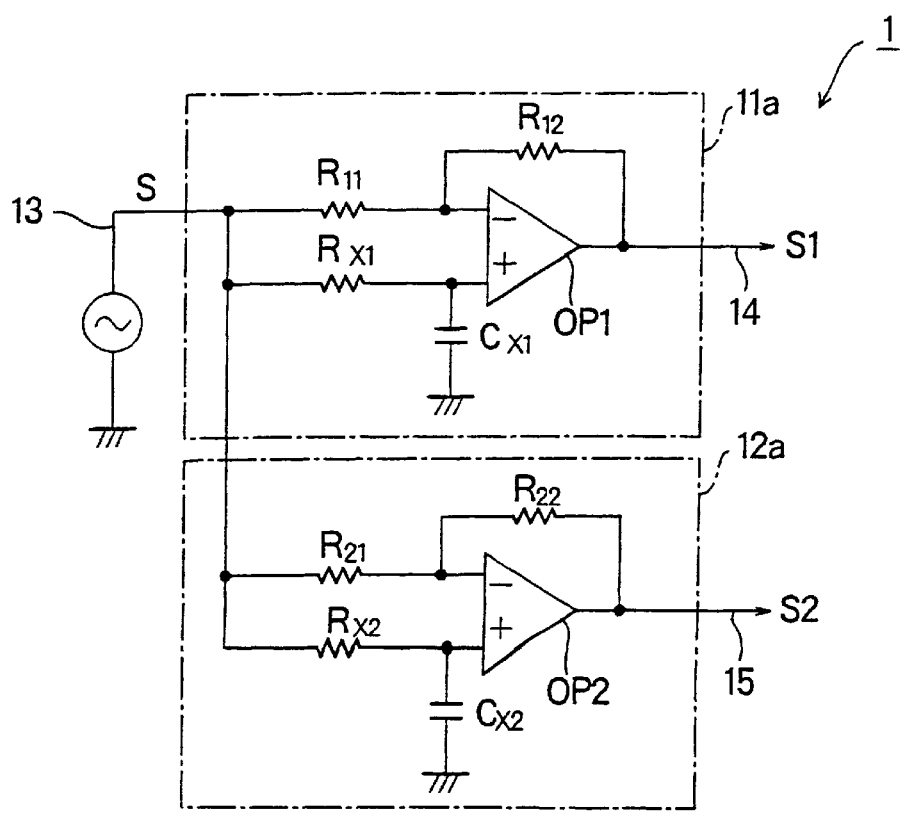
FIG. 6 shows another 90° phase shift circuit.

FIG. 6 shows another embodiment of the phase controlling circuit 1. In the above-described embodiment, both of the first and second 90° phase shift circuits 11 and 12 are phase-lead circuits. Contrary, both of the first and second 90° phase shift circuits 11a and 12a shown in FIG. 6 are phase-delay type all-pass filters. For the purpose of phase-delay, the resistors Rx1, Rx2 and the capacitors Cx1, Cx2 are arranged contrary to that of FIG. 2. By setting the resistors Rx1, Rx2 and the capacitors Cx1, Cx2, this phase controlling circuit 1 can also generate two sinusoidal signals S1 and S2, which have 90° different phases from each other around the fundamental frequency f0.

Figure 7:
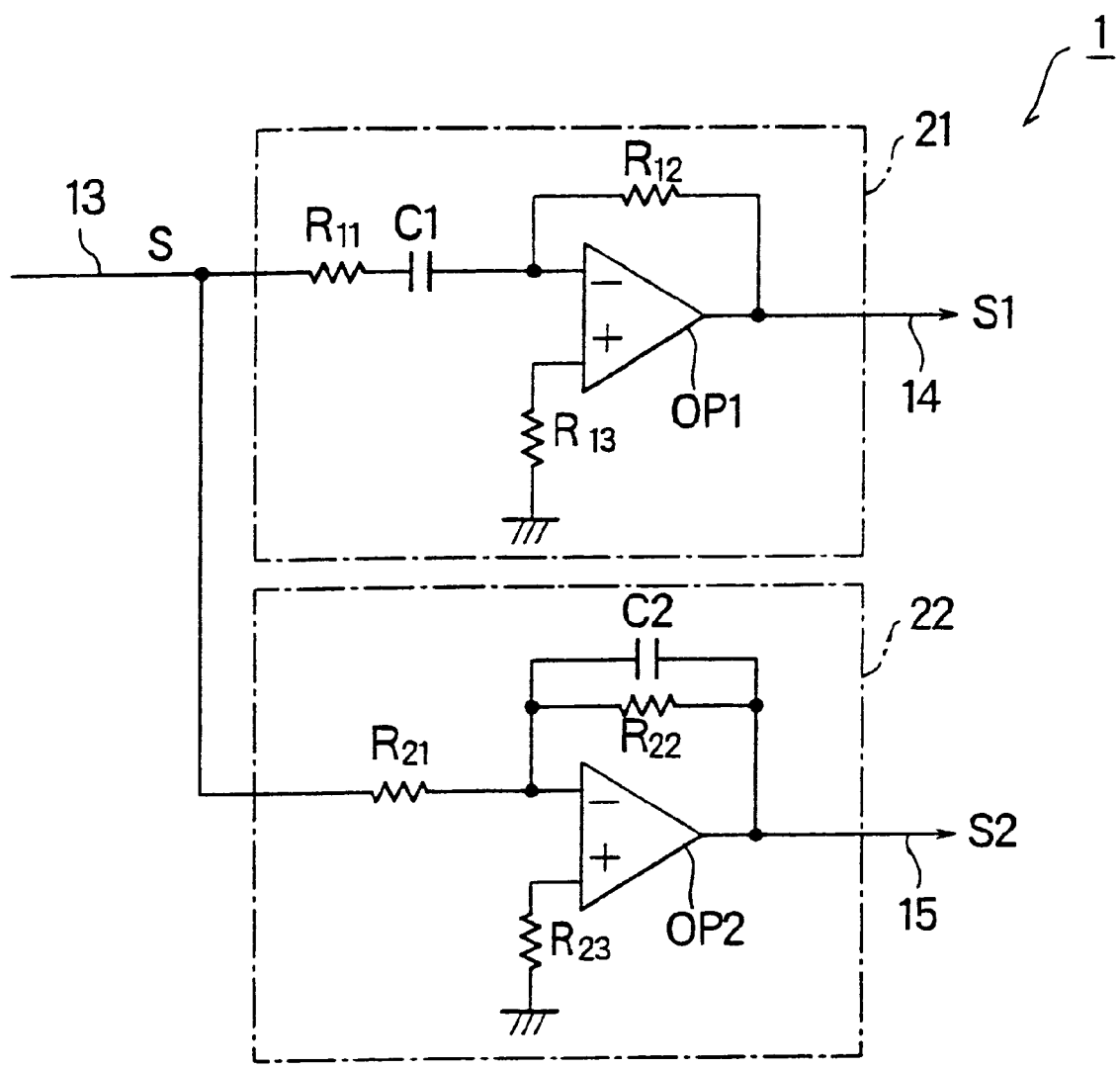
FIG. 7 shows another phase controlling circuit.

FIG. 7 shows another embodiment of the phase controlling circuit 1. This phase controlling circuit 1 comprises first and second negative feedback amplifiers 21 and 22 with the operational amplifier OP1 and OP2, respectively. The first and second amplifiers 21 and 22 have a common signal input terminal 13 and the respective signal output terminals 14 and 15. In the first amplifier 21, a capacitor C1 is connected to the input resistor R11 in series. The capacitor C1 is set to give phase-lead of β in the transmitted signal at the fundamental frequency f0. As a result, at the signal output terminal 14 of the amplifier 21, the first sinusoidal signal S1 can be generated with phase-lead of β in comparison with the input sinusoidal signal S at the fundamental frequency f0. In the second amplifier 22, a capacitor C2 is connected in parallel with the feedback resistor R22. The capacitor C2 is set to give phase-delay of β−90° in the transmitted signal at the fundamental frequency f0. Therefore, at the signal output terminal 15, the second sinusoidal signal S2 can be generated with phase-delay of β−90° in comparison with the input sinusoidal signal S at the fundamental frequency f0.

As similar to the above-described embodiment, the phase controlling circuit 1 shown in FIG. 7 can also generate two sinusiodal signals with 90° phase different from each other, as shown in the expression (2).

Since the circuit element of the phase controlling circuit 1 shown in FIG. 7 is not phase shift circuit composed of all-pass filter, when the input sinusoidal signal is shifted from the fundamental frequency, the amplitude varies. However, when the frequency shift is not so large, the amplitude variation is negligible small. Therefore, in this embodiment, amplitude detecting can be performed with such a high speed responsibility as the above-described embodiment.

As above-described, by combination of phase controlling of the input sinusoidal signal to generate the first and second sinusoidal signals with 90° phase difference, squaring these signals to generate the first and second squared sinusoidal signals, and signal adding these signals, it is able to remove the fundamental frequency component of the input sinusoidal signal without smoothing filters so as to obtain an amplitude of the input sinusoidal signal. Since smoothing filters are not used, even when the amplitude information includes high frequency component, the amplitude can be detected without time delay. Therefore, in the case that the input signal is an output of a touch signal probe driven by a piezoelectric device, high speed amplitude detecting can be performed.

What is claimed is:

1. An amplitude detecting device, comprising:

phase controlling means for controlling phase of an input sinusoidal signal to generate first and second sinusoidal signals which have different phases of 90° shifted from each other;

first signal generating means for squaring said first sinusoidal signal output from said phase controlling means to generate a first squared sinusoidal signal;

second signal generating means for squaring said second sinusoidal signal output from said phase controlling means to generate a second squared sinusoidal signal; and signal adding means for adding said first and second squared sinusoidal signals output from said first and second signal generating means to output an amplitude of said input sinusoidal signal, wherein said phase controlling means comprises first and second 90° phase shift circuits which have a common signal input terminal to which said input sinusoidal signal is provided and respective signal output terminals, said first 90° phase shift circuit being composed of an all-pass filter whose central frequency of phase shift is set to be f0−Δ f so as to generate said first sinusoidal signal, said second 90° phase shift circuit being composed of an all-pass filter whose central frequency of phase shift is set to be f0+Δ f so as to generate said second sinusoidal signal of which phase is 90° different from said first sinusoidal signal, where a frequency of said input sinusoidal signal is between f0+Δ f and f0−Δ f.

2. The amplitude detecting device according to claim 1, wherein said input sinusoidal signal is a sinusoidal signal output from a touch signal probe driven by a piezoelectric device.

3. The amplitude detecting according to claim 1, wherein both of said first and second 90° phase shift circuits are composed of phase-lead circuits.

4. The amplitude detecting according to claim 1, wherein both of said first and second 90° phase shift circuits are composed of phase-delay circuits.

5. The amplitude detecting device according to claim 1, wherein said first and second signal generating means are composed of analog multiplying circuits to which said first and second sinusoidal signals are provided as multiplier and multiplicand, respectively.

6. The amplitude detecting device according to claim 1, wherein said signal adding means is composed of an analog adder.

7. An amplitude detecting device for detecting an amplitude of an output sinusoidal signal output from a touch signal probe with a vibrating stylus driven by a piezoelectric device, comprising:

phase controlling means for controlling phase of said output sinusoidal signal to generate first and second sinusoidal signals which have different phases of 90° shifted from each other;

first signal generating means for squaring said first sinusoidal signal output from said phase controlling means to generate a first squared sinusoidal signal;

second signal generating means for squaring said second sinusoidal signal output from said phase controlling means to generate a second squared sinusoidal signal; and signal adding means for adding said first and second squared sinusoidal signals output from said first and second signal generating means to output said amplitude of said output sinusoidal signal, wherein said phase controlling means comprises first and second 90° phase shift circuits which have a common signal input terminal to which said output sinusoidal signal is provided and respective signal output terminals, said first 90° phase shift circuit being composed of an all-pass filter whose central frequency of phase shift is set to be $f0-\Delta f$ so as to generate said first sinusoidal signal, said second 90° phase shift circuit being composed of an all-pass filter whose central frequency of phase shift is set to be $f0+\Delta f$ so as to generate said second sinusoidal signal of which phase is 90° different from said first sinusoidal signal, where a frequency of said output sinusoidal signal is between $f0+\Delta f$ and $f0-\Delta f$.

8. The amplitude detecting device according to claim 7, wherein both of said first and second 90° phase shift circuits are composed of phase-lead circuits.

9. The amplitude detecting device according to claim 7, wherein both of said first and second 90 phase shift circuits are composed of phase-delay circuits.

10. The amplitude detecting device according to claim 7, wherein said first and second signal generating means are composed of analog multiplying circuits to which said first and second sinusoidal signals are provided as multiplier and multiplicand, respectively.

11. The amplitude detecting device according to claim 7, wherein said signal adding means is composed of an analog adder.

* * * * *